US010752714B2

(12) United States Patent
Adachi et al.

(10) Patent No.: US 10,752,714 B2
(45) Date of Patent: *Aug. 25, 2020

(54) RESIN COMPOSITION

(71) Applicant: NISSAN CHEMICAL INDUSTRIES, LTD., Tokyo (JP)

(72) Inventors: Isao Adachi, Funabashi (JP); Takahiro Sakaguchi, Funabashi (JP); Yuki Sugawara, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 201 days.

This patent is subject to a terminal disclaimer.

(21) Appl. No.: 15/781,404

(22) PCT Filed: Nov. 30, 2016

(86) PCT No.: PCT/JP2016/085575
§ 371 (c)(1),
(2) Date: Jun. 4, 2018

(87) PCT Pub. No.: WO2017/110393
PCT Pub. Date: Jun. 29, 2017

(65) Prior Publication Data
US 2018/0362685 A1 Dec. 20, 2018

(30) Foreign Application Priority Data
Dec. 21, 2015 (JP) ................. 2015-248926

(51) Int. Cl.
B05D 1/38 (2006.01)
B05D 3/02 (2006.01)
C08L 25/08 (2006.01)
C08L 33/06 (2006.01)
C08L 63/00 (2006.01)
C08F 212/08 (2006.01)
G03F 7/09 (2006.01)
C08K 5/134 (2006.01)
G02B 3/00 (2006.01)
(Continued)

(52) U.S. Cl.
CPC .......... C08F 212/08 (2013.01); C08F 220/18 (2013.01); C08F 220/30 (2013.01);
(Continued)

(58) Field of Classification Search
None
See application file for complete search history.

(56) References Cited

U.S. PATENT DOCUMENTS 9,823,391 B2 * 11/2017 Sakaguchi ............ C08F 220/20
2012/0270151 A1 10/2012 Kikuchi et al.
2015/0338556 A1 * 11/2015 Sakaguchi ............ C08F 220/20
523/400

FOREIGN PATENT DOCUMENTS

EP 2 913 352 A1 9/2015
JP S64-10666 A 1/1989
(Continued)

OTHER PUBLICATIONS

Machine translation of JP 2005-292483 A (no date).*
(Continued)

Primary Examiner — Michael J Feely
(74) Attorney, Agent, or Firm — Oliff PLC

(57) ABSTRACT

There is provided a thermosetting resin composition. A resin composition, comprising: (A) component, (B) component, and a solvent, wherein the content of the (B) component is 0.1 to 5.0% by mass with respect to the content of all components of the resin composition, except the solvent:
(A) component: a self-crosslinking copolymer having a structural unit of Formula (1) below and a structural unit of Formula (2) below
(B) component: a compound of Formula (3) below wherein $R^0$ is each independently a hydrogen atom or a methyl group, X is —O— or —NH—, $R^1$ is a single bond or an alkylene group, $R^2$ is an alkyl group, a is an integer of 1 to 5, b is an integer of 0 to 4, $R^3$ is a divalent organic group having an ether bond and/or an ester bond, $R^5$ is an alkyl group, f is an integer of 1 to 5, g is an integer of 0 to 4, $R^6$ is a single bond or an alkylene group, Y is a single bond or an ester bond, A is a mono- to tetra-valent organic group which optionally contain at least one hetero atom, or a hetero atom, and h is an integer of 1 to 4.

11 Claims, 2 Drawing Sheets

(51) Int. Cl.
    *C08F 220/18*     (2006.01)
    *C08F 220/32*     (2006.01)
    *G03F 7/00*     (2006.01)
    *C09D 133/06*     (2006.01)
    *C08F 220/30*     (2006.01)
    *C08G 59/18*     (2006.01)
    *G02B 1/04*     (2006.01)
    *G03F 7/40*     (2006.01)
    *G02B 1/18*     (2015.01)
    *C08J 3/24*     (2006.01)
    *C08J 5/18*     (2006.01)
    *C08K 5/13*     (2006.01)
    *C08K 5/1575*     (2006.01)

(52) U.S. Cl.
    CPC ............ *C08F 220/32* (2013.01); *C08G 59/18* (2013.01); *C08J 3/24* (2013.01); *C08J 5/18* (2013.01); *C08K 5/13* (2013.01); *C08K 5/134* (2013.01); *C08K 5/1345* (2013.01); *C08K 5/1575* (2013.01); *C09D 133/068* (2013.01); *G02B 1/04* (2013.01); *G02B 1/041* (2013.01); *G02B 1/18* (2015.01); *G02B 3/00* (2013.01); *G03F 7/0007* (2013.01); *G03F 7/094* (2013.01); *G03F 7/40* (2013.01); *C08F 2800/20* (2013.01); *C08F 2810/20* (2013.01); *C08J 2325/14* (2013.01)

(56) References Cited

FOREIGN PATENT DOCUMENTS

| JP | H06-112459 A | 4/1994 |
| --- | --- | --- |
| JP | 2005-292483 A | 10/2005 |
| JP | 2006-251464 A | 9/2006 |
| JP | 2007-033518 A | 2/2007 |
| JP | 2007-171572 A | 7/2007 |
| WO | 2011/046230 A1 | 4/2011 |
| WO | 2014/065100 A1 | 5/2014 |

OTHER PUBLICATIONS

Sep. 11, 2019 Extended European Search Report issued in European Patent Application No. 16878286.
Feb. 7, 2017 Search Report issued in International Patent Application No. PCT/JP2016/085575.
Feb. 7, 2017 Written Opinion issued in International Patent Application No. PCT/JP2016/085575.

* cited by examiner

Example 1

Example 2

Example 3

Example 4

Comparative Example 1

Comparative Example 2

Example 1

Example 2

Example 3

Example 4

Comparative Example 1

Comparative Example 2

RESIN COMPOSITION

TECHNICAL FIELD

The present invention relates to a resin composition, and a cured film, a protective film, a planarization film and a microlens, which are formed from the resin composition. The resin composition of the present invention is a composition that does not contain a photosensitizer such as a quinone diazide compound, and a self-crosslinking copolymer included in the resin composition of the present invention forms a cured film by performing thermal crosslinking for copolymers without a crosslinking agent.

BACKGROUND ART

An electronic device, for example, a liquid crystal display or a CCD/CMOS image sensor, undergoes exposure to a solvent or a chemical liquid such as an acid or alkali solution, or exposure to a high temperature through sputtering, dry etching, solder reflow and the like in a manufacturing process thereof. In order to prevent degradation of or damage to an element by such treatments, a cured film resistant to such treatments, as a protective layer, is formed on the element. For such a protective film, chemical resistance, high transparency, heat resistance, moisture resistance, and the like. are required. To manufacture an electronic device having high reliability, the cured film also needs long-term heat resistance and moisture resistance.

When the cured film is formed on an uneven surface such as a color filter, in terms of ensuring process margin in a subsequent process or the uniformity of device properties, a cured film with high planarization property is required. In addition, a microlens is also manufactured from such the cured film.

A known method for manufacturing a microlens for a CCD/CMOS image sensor is an etch back method (Patent Documents 1 and 2). In other words, a resist pattern is formed on a resin layer for a microlens, which is formed on a color filter, and then reflowed by thermal treatment, thereby forming a lens pattern. The underlying resin layer for a microlens undergoes etch-back using the lens pattern formed by reflowing the resist pattern as an etching mask, and the shape of the lens pattern is transferred to the resin layer for a microlens, thereby manufacturing a microlens.

For example, in Patent Document 3 to Patent Document 5, resin compositions used for forming a microlens are disclosed. However, all compositions are photosensitive (radiation-sensitive) resin compositions, and the compositions may not be suitable materials for forming a microlens by performing the above-mentioned etch-back method.

In Patent Document 6, a non-photosensitive resin composition used for forming a microlens is disclosed. However, the moisture resistance of a film formed from the non-photosensitive resin composition is not known.

PRIOR ART DOCUMENTS

Patent Documents

Patent Document 1: Japanese Patent Application Publication No. H01-10666 (JP H01-10666 A)
Patent Document 2: Japanese Patent Application Publication No. H06-112459 (JP H06-112459 A)
Patent Document 3: Japanese Patent Application Publication No. 2006-251464 (JP 2006-251464 A)
Patent Document 4: Japanese Patent Application Publication No. 2007-033518 (JP 2007-033518 A)
Patent Document 5: Japanese Patent Application Publication No. 2007-171572 (JP 2007-171572 A)
Patent Document 6: International Publication No. WO 2014/065100

SUMMARY OF THE INVENTION

Problem to be Solved by the Invention

The present invention has been accomplished on the basis of the above-described circumstances, and an object of the present invention is to provide a resin composition which is capable of forming a cured film having excellent chemical resistance, excellent heat resistance, excellent moisture resistance, excellent transparency and an excellent planarization property. In addition, another object of the present invention is to provide a microlens having excellent chemical resistance, excellent heat resistance, excellent moisture resistance and excellent transparency.

Means for Solving the Problems

In an effort for intensive investigation to solve the above-described problems, the inventors completed the present invention. In other words, the present invention provides a resin composition, comprising (A) component described below, (B) component described below and a solvent, and the content of the (B) component is 0.1 to 5.0% by mass with respect to the content of all components of the resin composition, except the solvent.

(A) component: a self-crosslinking copolymer having a structural unit of Formula (1) below and a structural unit of Formula (2) below
(B) component: a compound of Formula (3) below

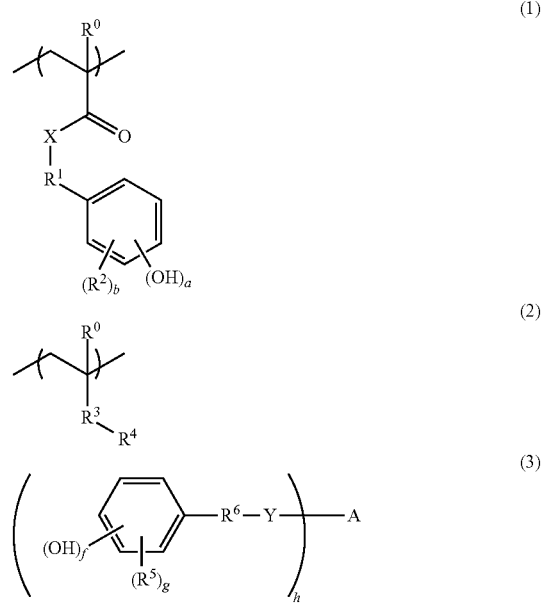

(wherein $R^0$ is each independently a hydrogen atom or a methyl group, X is an —O— group or an —NH— group, $R^1$ is a single bond or a linear or branched alkylene group having a carbon atom number of 1 to 6, $R^2$ is a linear or branched alkyl group having a carbon atom number of 1 to 6, a is an integer of 1 to 5, b is an integer of 0 to 4, a and b satisfy 1≤a+b≤5, and $R^2$ are optionally different from each other when b is 2, 3 or 4, $R^3$ is a divalent organic group of Formula (I), (II) or (III) below, the carbonyl group in Formula (I) is bonded to the main chain of the structural unit of Formula (2) when $R^3$ is a divalent organic group of Formula (I) below, $R^4$ is an organic group having an epoxy group, $R^5$ is a linear or branched alkyl group having a carbon atom number of 1 to 6, f is an integer of 1 to 5, g is an integer of 0 to 4, and f and g satisfy 1≤f+g≤5, and $R^5$ are optionally different from each other when g is 2, 3 or 4, $R^6$ is a single bond or a linear or branched alkylene group having a carbon atom number of 1 to 6, Y is a single bond or an ester bond, A is a monovalent, divalent, trivalent or tetravalent organic group which optionally contain at least one hetero atom, or a hetero atom, and h is an integer of 1 to 4)

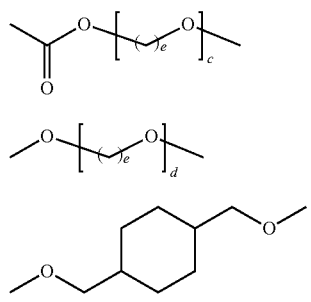

(I)

(II)

(III)

(wherein c is an integer of 0 to 3, d is an integer of 1 to 3, and e in each formula is independently an integer of 2 to 6).

In the compound of Formula (3), when A is a monovalent, divalent, trivalent or tetravalent organic group containing at least one hetero atom, or a hetero atom, as the hetero atom, for example, a nitrogen atom, an oxygen atom or a sulfur atom is optionally be used. In addition, as the monovalent, divalent, trivalent or tetravalent organic group, for example, a linear or branched hydrocarbon group having a carbon atom number of 1 to 20, an aromatic hydrocarbon group, or a heterocyclic group is optionally used. Moreover, when Y is an ester bond, the ester bond is —C(=O)O—. Formula (3) is, for example, any one of Formulas (3a) to (3e):

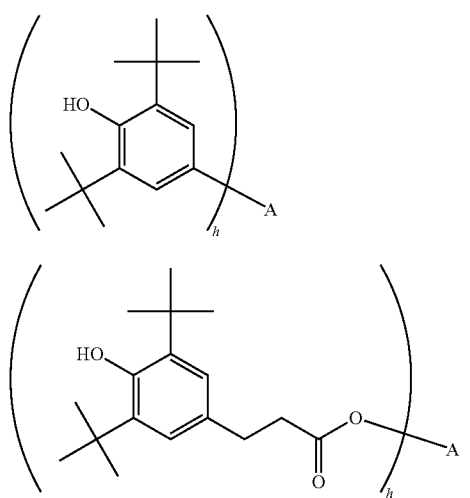

(3a)

(3b)

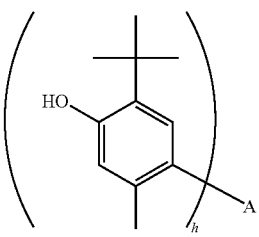

(3c)

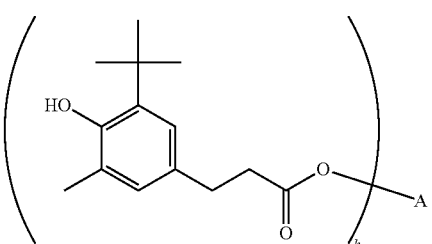

(3d)

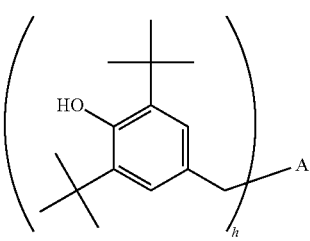

(3e)

(wherein A and h are the same as defined in Formula (3)).

The structural unit of Formula (2) is, for example, a structural unit of Formula (2-1) or (2-2) below:

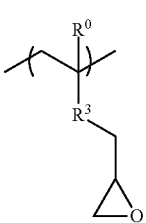

(2-1)

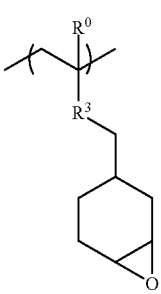

(2-2)

(wherein $R^0$ is each independently a hydrogen atom or a methyl group, and $R^3$ is a divalent organic group of Formula (I), (II) or (III)).

The self-crosslinking copolymer of (A) component is optionally further contain a structural unit of Formula (4) below:

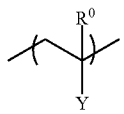

(4)

(wherein $R^0$ is each independently a hydrogen atom or a methyl group, Y is a phenyl group, a biphenylyl group or a naphthyl group, some or all hydrogen atoms of the phenyl group, the biphenylyl group and the naphthyl group is optionally substituted with an alkyl group having a carbon atom number of 1 to 10, an alkoxy group having a carbon atom number of 1 to 10, a cyano group or a halogeno group).

The resin composition of the present invention is used as, for example, a resin composition for a protective film, a resin composition for a planarization film, and a resin composition for a microlens. The present invention also provides a method for manufacturing a cured film, which includes applying the resin composition onto a base and baking the resin composition at 80 to 300° C. for 0.3 to 60 minutes. The present invention also provides a method for manufacturing a microlens, which includes forming a resist pattern on the cured film manufactured by the above-described method, reflowing the resist pattern by heat treatment to form a lens pattern, and performing etch-back of the cure film using the lens pattern as a mask to transfer the shape of the lens pattern to the cured film.

Effects of the Invention

A cured film formed from the resin composition of the present invention has excellent chemical resistance, excellent heat resistance, excellent moisture resistance, excellent transparency and an excellent planarization property. Therefore, in a process of forming the cured film, or forming peripheral devices such as wiring, when the cured film formed from the resin composition of the present invention is exposed to a solvent or a chemical liquid such as an acid or alkali solution, or exposed to a high temperature through-sputtering, dry etching or solder reflow, it is possible to considerably reduce the deterioration or damage of an element. Further, when the cured film formed from the resin composition of the present invention is used, an electronic device having high reliability can be manufactured. In addition, when a protective film, a planarization film or a microlens is formed from the resin composition of the present invention, and a resist is applied or an electrode/wiring is formed thereon, a problem of mixing with the resist or transformation and peeling of the protective film, planarization film or microlens due to a chemical liquid can be considerably reduced. Therefore, the resin composition of the present invention is suitable as a material for forming a protective film, a planarization film or a microlens.

Modes for Carrying out the Invention

The present invention relates to a resin composition, which includes a self-crosslinking copolymer, a compound of Formula (3) shown above and a solvent. Hereinafter, details of each component will be described. In the resin composition of the present invention, all components (hereinafter also referred to as "solid contents") except the solvent are generally included at 1 to 50% by mass with respect to the total mass of the resin composition.

<(A) Component>

(A) component included in the resin composition of the present invention is a self-crosslinking copolymer, and has a structural unit of Formula (1) shown above and a structural unit of Formula (2) shown above.

Specific examples of compounds (monomers) forming the structural unit of Formula (1) shown above include 2-hydroxyphenyl (meth)acrylate, 3-hydroxyphenyl (meth)acrylate, 4-hydroxyphenyl (meth)acrylate, 4-hydroxybenzyl (meth)acrylate, 4-hydroxyphenethyl (meth)acrylate, 3,5-dimethyl-4-hydroxyphenyl (meth)acrylate, 3,5-dimethyl-4-hydroxybenzyl (meth)acrylate, 3,5-dimethyl-4-hydroxyphenethyl (meth)acrylate, N-(2-hydroxyphenyl) (meth)acrylamide, N-(3-hydroxyphenyl) (meth)acrylamide, N-(4-hydroxyphenyl) (meth)acrylamide, N-(4-hydroxybenzyl) (meth)acrylamide, N-(4-hydroxyphenethyl) (meth)acrylamide, N-(3,5-dimethyl-4-hydroxyphenyl) (meth)acrylamide, N-(3,5-dimethyl-4-hydroxybenzyl) (meth)acrylamide, and N-(3,5-dimethyl-4-hydroxyphenethyl) (meth)acrylamide. Moreover, these compounds may be used alone or in combination of two or more thereof, and in the specification, "(meth)acrylate" refers to a methacrylate and an acrylate, and "(meth)acrylamide" refers to a methacrylamide and an acrylamide.

Specific examples of the compounds (monomers) forming the structural unit of Formula (2) include monomers of Formulas (2-3) to (2-18) below. Moreover, these monomers may be used alone or in combination of two or more thereof.

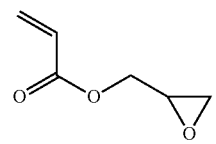

(2-3)

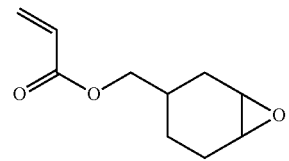

(2-4)

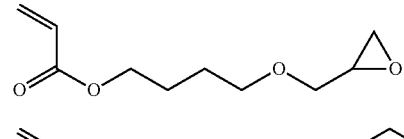

(2-5)

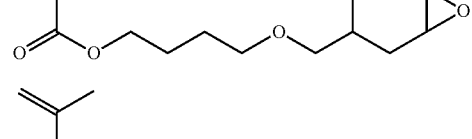

(2-6)

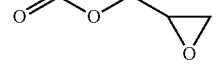

(2-7)

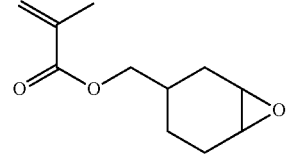

(2-8)

-continued

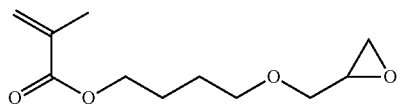
(2-9)

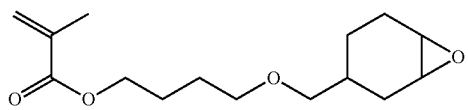
(2-10)

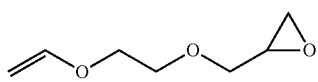
(2-11)

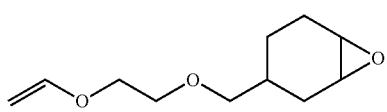
(2-12)

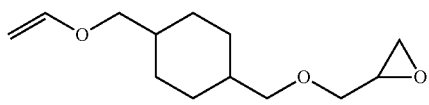
(2-13)

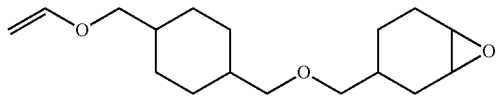
(2-14)

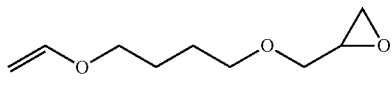
(2-15)

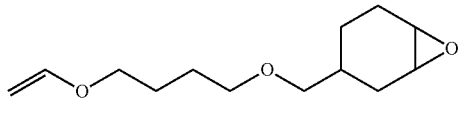
(2-16)

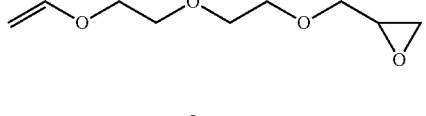
(2-17)

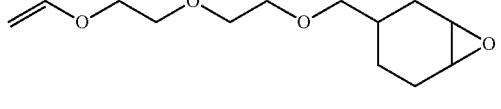
(2-18)

The self-crosslinking copolymer included in the resin composition of the present invention may have the structural unit of Formula (4) in addition to the structural unit of Formula (1) and the structural unit of Formula (2). It is possible to adjust optical properties or a dry etching rate of the cured film in a wider range by adjusting the content of the structural unit of Formula (4).

Specific examples of compounds (monomers) forming the structural unit of Formula (4) shown above include styrene, a-methylstyrene, 2-methylstyrene, 3-methylstyrene, 4-methyl styrene, 4-tert-butylstyrene, 4-methoxystyrene, 4-cyanostyrene, 4-fluorostyrene, 4-chlorostyrene, 4-bromostyrene, 4-vinylbiphenyl, 1-vinyl naphthalene and 2-vinyl naphthalene. These compounds may be used alone or in combination of two or more thereof.

In the self-crosslinking copolymer having the structural unit of Formula (1) and the structural unit of Formula (2), with respect to the sum of the structural units of Formula (1) and the structural units of Formula (2) of 100 mol %, the content ratio of the structural unit of Formula (1) is 5 to 95 mol %, and preferably 10 to 90 mol %, and the content ratio of the structural unit of Formula (2) is 5 to 95 mol %, and preferably 10 to 90 mol %.

When the self-crosslinking copolymer further has a structural unit of Formula (4), with respect to the sum of the structural units of Formula (1), the structural units of Formula (2) and the structural units of Formula (4) of 100 mol %, the content ratio of the structural unit of Formula (1) is 5 to 90 mol %, and preferably 10 to 80 mol %, and the content ratio of the structural unit of Formula (2) is 5 to 90 mol %, and preferably 10 to 80 mol %, and the content ratio of the structural unit of Formula (4) is 5 to 90 mol %, and preferably 10 to 80 mol %.

The self-crosslinking copolymer has a weight average molecular weight of 1,000 to 100,000, and preferably 3,000 to 50,000. In addition, the weight average molecular weight is a value obtained by gel permeation chromatography (GPC) using a polystyrene as a standard sample.

In addition, in the resin composition of the present invention, the content ratio of the self-crosslinking copolymer is generally 1 to 99% by mass, and preferably 5 to 95% by mass with respect to the content ratio of the solid contents of the resin composition.

In the present invention, while a method for obtaining the self-crosslinking copolymer is not particularly limited, the self-crosslinking copolymer is obtained by polymerizing a compound (monomer) forming the structural unit of Formula (1) and a compound (monomer) forming the structural unit of Formula (2), or a compound (monomer) forming the structural unit of Formula (4) in addition to the above-mentioned compounds (monomers) in a solvent in the presence of a polymerization initiator at a temperature of, generally, 50 to 120° C. The copolymer obtained thereby is generally present in a solvent-dissolved solution state, and may be used as it is for the resin composition of the present invention without isolation.

In addition, the self-crosslinking copolymer solution obtained as described above may be added to a stirred poor solvent of hexane, diethylether, methanol or water to precipitate the corresponding copolymer, and after filtering and washing the produced precipitate, the resulting filtrate may be dried at room temperature or by heat treatment under a normal pressure or reduced pressure, thereby obtaining a powder. According to such operations, a polymerization initiator or unreacted compounds, coexisting with the self-crosslinking copolymer may be removed. In the present invention, the self-crosslinking copolymer powder may be used as it is, or may be used in a solution state after being redissolved in a solvent that will be described later.

<(B) Component>

The (B) component included in the resin composition of the present invention is the compound of Formula (3) and added as an antioxidant. As a specific example of the compound of Formula (3), compounds of Formulas (3-1) to (3-10) below may be used. In addition, these compounds may be used alone or in combination of two or more thereof.

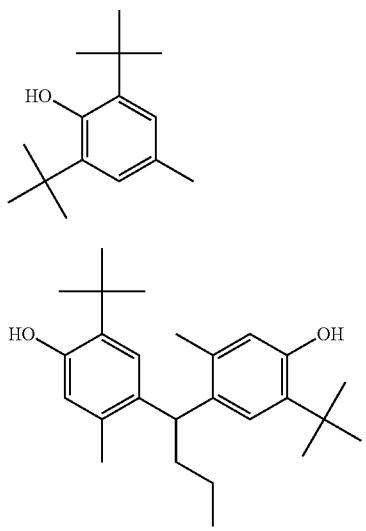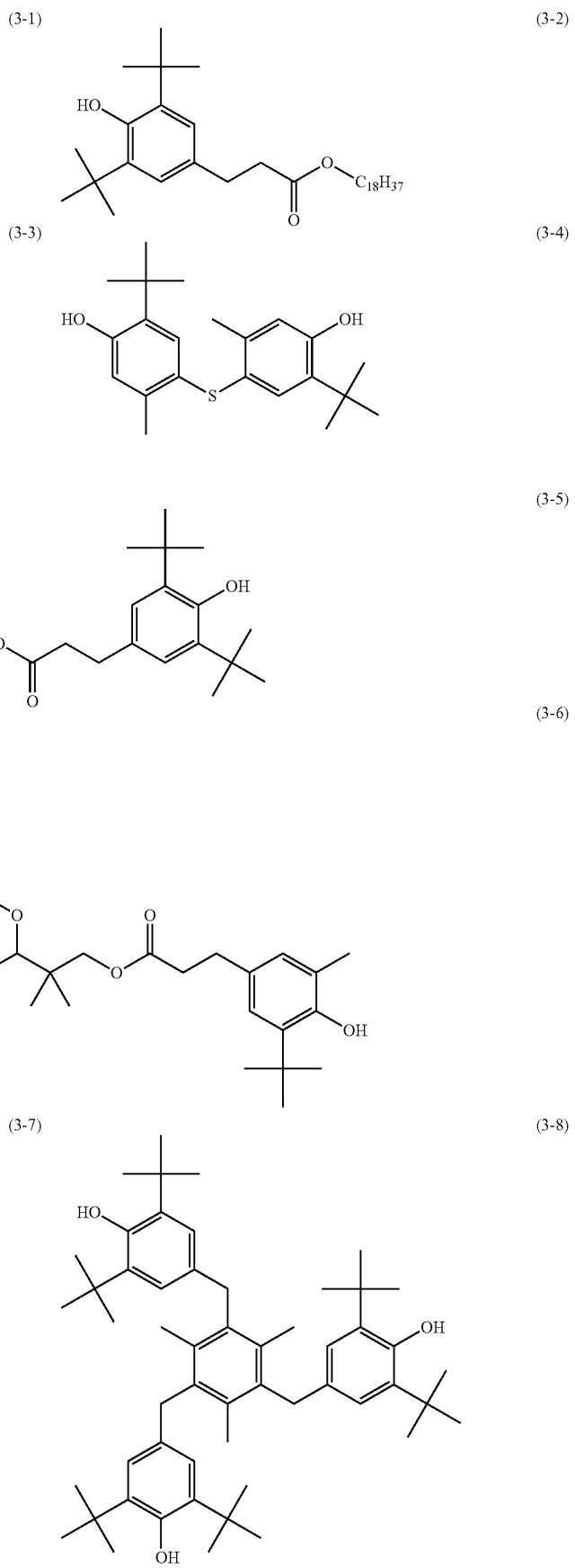

(3-9)

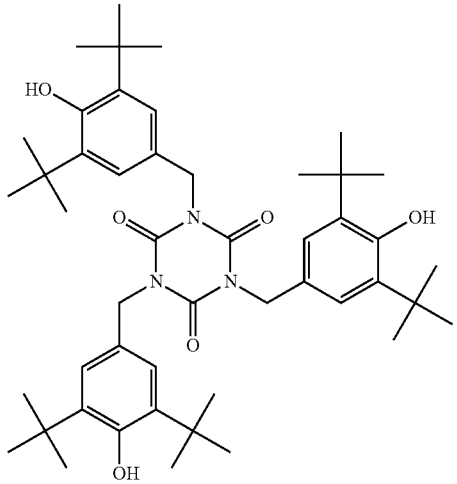

(3-10)

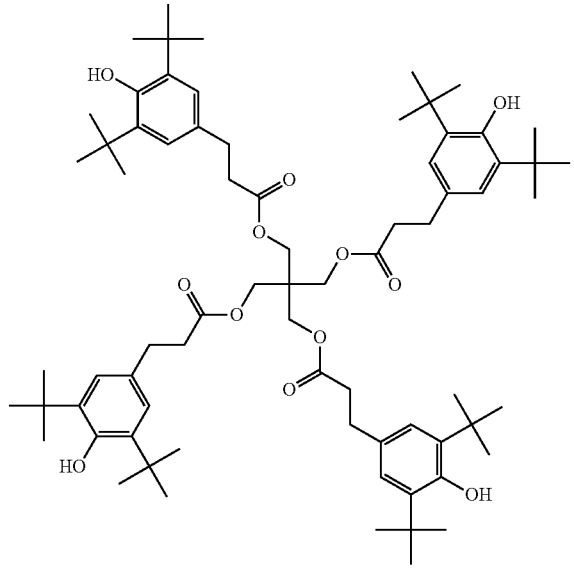

In addition, the content of the (B) component in the resin composition of the present invention is 0.1 to 5.0% by mass, and preferably 0.2 to 5.0% by mass with respect to the solid content of the resin composition. When the content of the (B) component exceeds 5.0% by mass, a cured film formed on a base using the resin composition including the (B) component is not preferable because of low long-term heat resistance, low moisture resistance, and degradation of a planarization property of the cured film, caused by impurities generated on a surface of the cured film.

While a method of preparing the resin composition of the present invention is not particularly limited, the method may be, for example, a method of preparing a uniform solution by dissolving a copolymer having the structural unit of Formula (1) and the structural unit of Formula (2), or a copolymer having the structural unit of Formula (1), the structural unit of Formula (2) and the structural unit of Formula (4), and the compound of Formula (3) in a solvent. This method may further include adding additives, other than the above-mentioned components, and mixing them with the other components in a suitable step of the preparation method, if necessary.

As the solvent, any solvent may be used without particular limitation as long as the self-crosslinking copolymer and the compound of Formula (3) dissolve in the solvent. Examples of such solvents are ethylene glycol monomethylether, ethylene glycol monoethylether, methylcellosolve acetate, ethylcellosolve acetate, diethylene glycol monomethylether, diethylene glycol monoethylether, propylene glycol, propylene glycol monomethylether, propylene glycol monomethylether acetate, propylene glycol monoethylether, propylene glycol monoethylether acetate, propylene glycol propylether acetate, propylene glycol monobutylether, propylene glycol monobutylether acetate, toluene, xylene, methylethylketone, cyclopentanone, cyclohexanone, ethyl 2-hydroxypropionate, ethyl 2-hydroxy-2-methylpropionate, ethyl ethoxy acetate, ethylhydroxy acetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl acetate, butyl acetate, ethyl lactate, butyl lactate, 2-heptanone, and y-butyrolactone. These solvents may be used alone or in combination of two or more thereof.

Among these solvents, in terms of an improved leveling property of the cured film formed by coating the base with the resin composition of the present invention, propylene glycol monomethylether, propylene glycol monomethylether acetate, propylene glycol monoethylether, propylene glycol monopropylether, 2-heptanone, ethyl lactate, butyl lactate, cyclopentanone and cyclohexanone are preferable.

In addition, the resin composition of the present invention may contain a surfactant to improve coatability. Examples of the surfactants are nonionic surfactants, for example, polyoxyethylene alkyl ethers such as polyoxyethylene lauryl ether, polyoxyethylene stearyl ether, polyoxyethylene cetyl ether and polyoxyethylene oleyl ether, polyoxyethylene alkylaryl ethers such as polyoxyethyleneoctyl phenyl ether and polyoxyethylenenonyl phenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants, for example, EFTOP [Registered trademark] EF301, EFTOP EF303, EFTOP EF352 (produced by Mitsubishi Materials Electronic Chemicals Co., Ltd.), MEGAFACE [Registered trademark] F-171, MEGAFACE F-173, MEGAFACE R-30, MEGAFACE R-40, MEGAFACE R-40-LM (produced by DIC Corp.), FLUORAD [Registered trademark] FC430, FLUORAD FC431 (produced by Sumitomo 3M Ltd.), ASAHI GUARD [Registered trademark] AG710, SURFLON [Registered trademark] S-382, SURFLON SC101, SURFLON SC102, SURFLON SC103, SURFLON SC104, SURFLON SC105, SURFLON SC106 (produced by Asahi Glass Co., Ltd.), FTERGENT series (Neos Co., Ltd.) such as FTX-206D, FTX-212D, FTX-218, FTX-220D, FTX-230D, FTX-240D, FTX-212P, FTX-220P, FTX-228P and FTX-240G; and organosiloxane polymer KP341 (produced by Shin-Etsu Chemical Co., Ltd.). These surfactants may be used alone or in combination of two or more thereof.

In addition, when the surfactant described above is used, the content of the surfactant in the resin composition of the present invention is 0.001 to 3% by mass, preferably 0.005 to 1% by mass, and more preferably 0.01 to 0.5% by mass, with respect to the solid content of the resin composition.

Since a copolymer included in the resin composition is a self-crosslinking type, the resin composition of the present invention does not necessarily include a crosslinking agent, but if necessary, may include a crosslinking agent as long as it does not degrade the effects of the present invention. If necessary, the resin composition of the present invention may further include an additive such as a curing aid, an ultraviolet absorber, a sensitizer, a plasticizer, or an adhesion aid as long as it does not degrade the effects of the present invention.

<Method for Forming Cured Film, Protective Film and Planarization Film>

A method for forming a cured film, a protective film and a planarization film using the resin composition of the present invention will be described. A cured film, a protective film, or a planarization film is formed by applying the resin composition of the present invention onto a base (e.g., a semiconductor substrate, a glass substrate, a quartz substrate, a silicon wafer, and a substrate having various metal films or color filters formed on the surface thereof) by a suitable coating method, for example, using a spinner or a coater and baking the resin composition using a heating means such as a hot plate or an oven for curing. Baking conditions are suitably selected from a baking temperature of 80 to 300° C. and a baking time of 0.3 to 60 minutes. The baking may be performed in two or more steps. In addition, the cured film, protective film or planarization film formed thereby has a film thickness of, for example, 0.001 to 100 μm, and preferably 0.01 to 10 μm.

<Method of Forming Microlens>

An example of forming a microlens using the resin composition of the present invention will be described. A cured film is formed by applying the resin composition of the present invention onto a base (e.g., a semiconductor substrate, a glass substrate, a quartz substrate, a silicon wafer, and a substrate having various metal films or color filters formed on the surface thereof) by a suitable coating method, for example, using a spinner or a coater, and baking the resin composition using a heating means such as a hot plate or an oven for curing. Baking conditions are suitably selected from a baking temperature of 80 to 300° C. and a baking time of 0.3 to 60 minutes. The baking may be performed in two or more steps. In addition, the curing film formed thereby has a film thickness of, for example, 0.1 to 100 μm, and preferably 0.5 to 10 μm.

Afterward, a predetermined resist pattern is formed by applying a resist onto the cured film formed above, performing exposure on the resist using a predetermined mask, performing heating (post exposure bake (PEB)) after the exposure, if necessary, performing alkali development, rinsing off a developer, and drying the resulting film. For exposure, for example, g rays, i rays, a KrF excimer laser, or an ArF excimer laser may be used.

Subsequently, a lens pattern is formed by reflowing the resist pattern by heat treatment. The underlying cured film is etched-back using the lens pattern as an etching mask, and the shape of the lens pattern is transferred to the cured film. According to the above-described process, a microlens can be manufactured.

EXAMPLES

Hereinafter, the present invention will be described in further detail with reference to examples and comparative examples, but the present invention is not limited thereto.

MEASUREMENT OF WEIGHT AVERAGE MOLECULAR WEIGHT OF COPOLYMER OBTAINED IN FOLLOWING SYNTHESIS EXAMPLE

Apparatus: GPC System (produced by JASCO Corporation)
Column: Shodex [Registered trademark] KF-804L and 803L
Column Oven: 40° C.
Flow rate: 1 mL/min
Eluent: Tetrahydrofuran

[Synthesis of Self-Crosslinking Copolymer]

Synthesis Example 1

300 g of styrene, 205 g of 4-hydroxyphenyl methacrylate, 246 g of a monomer of Formula (2-7) shown above and 47.0 g of 2,2'-azobisisobutyronitrile were dissolved in 976 g of propylene glycol monomethylether, and then the solution was added dropwise to a flask containing 222 g of propylene glycol monomethylether being kept at 70° C. over 4 hours. After the dropwise addition, reaction was further performed for 18 hours, thereby obtaining a copolymer solution (concentration of a solid content: 40% by mass). The copolymer obtained thereby had a weight average molecular weight (Mw) of 21,000 (conversion to polystyrene).

[Preparation of Resin Composition]

Example 1

50.0 g of the self-crosslinking copolymer solution (concentration of a solid content: 40% by mass) obtained in Synthesis Example 1 as (A) component, 0.6 g of a compound of Formula (3-10) shown above as (B) component, and 0.01 g of MEGAFACE [registered trademark] R-30 (produced by DIC Corp.) as a surfactant were dissolved in 3.6 g of propylene glycol monomethylether acetate and 14.4 g of propylene glycol monomethylether, thereby forming a solution. Afterward, the solution was filtered using a polyethylene-based microfilter having a pore diameter of 0.10 μm, thereby preparing a resin composition Example 2

A resin composition was prepared under the same conditions as described in Example 1, except that 1.0 g of the compound of Formula (3-10) described above as (B) component, 4.3 g of propylene glycol monomethylether acetate and 14.7 g of propylene glycol monomethylether were used.

Example 3

A resin composition was prepared under the same conditions as described in Example 1, except that 0.1 g of the compound of Formula (3-8) described above as (B) component, 2.8 g of propylene glycol monomethylether acetate and 14.1 g of propylene glycol monomethylether were used.

Example 4

A resin composition was prepared under the same conditions as described in Example 1, except that 0.6 g of the compound of Formula (3-6) described above was used as (B) component.

Comparative Example 1

50.0 g of a self-crosslinking copolymer solution (concentration of a solid content: 40% by mass) as (A) component obtained in Synthesis Example 1 and 0.01 g of MEGAFACE [Registered trademark] R-30 (produced by DIC Corp.) as a surfactant were dissolved in 2.7 g of propylene glycol monomethylether acetate and 14.0 g of propylene glycol monomethylether, thereby forming a solution. Afterward, the solution was filtered using a polyethylene-based microfilter having a pore diameter of 0.10 thereby preparing a resin composition.

Comparative Example 2

A resin composition was prepared under the same conditions as used in Example 1, except that 1.6 g of the compound of Formula (3-10) described above as (B) component, 5.3 g of propylene glycol monomethylether acetate and 15.1 g of propylene glycol monomethylether were used.

[Chemical Resistance Test]

Each of the resin compositions prepared in Examples 1 to 4 and Comparative Examples 1 and 2 was applied onto a silicon wafer using a spin coater, and baked on a hot plate at 100° C. for 1 minute and at 150° C. for 10 minutes, thereby forming a cured film having a film thickness of 4 μm. A test of dipping the cured film in each of propylene glycol monomethylether, propylene glycol monomethylether acetate, ethyl lactate, butyl acetate, methyl 3-methoxypropionate, acetone, methylisobutylketone, 2-heptanone, 2-propanol, N-methylpyrrolidone and a tetramethylammonium hydroxide (TMAH) aqueous solution having a concentration of 2.38% by mass was performed at 23° C. for 10 minutes. A change in film thickness was estimated between before and after dipping by measuring a film thickness before and after dipping. When 10% or more increase or decrease in film thickness with respect to the film thickness before dipping was shown in at least one of the dipping solvents, chemical resistance was evaluated as "x," and when less than 10% increase or decrease in film thickness was shown in all solvents, chemical resistance was evaluated as "○." Evaluation results are shown in Table 1.

[Evaluation of Heat Resistance]

Each of the resin compositions prepared in Examples 1 to 4 and Comparative Examples 1 and 2 was applied onto each of a quartz substrate and a silicon wafer using a spin coater, and baked on a hot plate at 100° C. for 1 minute and at 150° C. for 10 minutes, thereby forming a cured film having a film thickness of 4 μm. Transmittance was measured for each cured film formed on the quartz substrate by changing a wavelength by 2 nm within a range of 400 to 800 nm using a UV-visible spectrophotometer UV-2550 (produced by Shimadzu Corp.). The lowest value of the measured transmittances was determined as the lowest transmittance, which is shown in Table 1. In addition, a surface of each cured film formed on the silicon wafer was observed using an optical microscope at a magnification of 100× to confirm that there were no impurities. Further, each of the cured films formed on the quartz substrate and the silicon wafer was heated in an oven at 150° C. for 1,000 hours. Afterward, transmittances were measured again for each cured film formed on the quartz substrate by changing a wavelength by 2 nm within a range of 400 to 800 nm, and the lowest value of the measured transmittances was determined as the lowest transmittance, which is shown in Table 1. In addition, a surface of each cured film formed on the silicon wafer was observed using an optical microscope at a magnification of 100×. When there was 5% or more decrease in transmittance with respect to the lowest transmittance before heating for 1,000 hours, heat resistance was evaluated as "x," when there was less than 5% decrease in transmittance, heat resistance was evaluated as "○," when impurities were generated on the surface of the cured film after heating for 1,000 hours, heat resistance was evaluated as "x," and when no impurities were generated, heat resistance was evaluated as "○." Evaluation results are shown in Table 1.

[Evaluation of Heat and Moisture Resistance]

Each of the resin compositions prepared in Examples 1 to 4 and Comparative Examples 1 and 2 was applied onto each of a quartz substrate and a silicon wafer using a spin coater, and baked on a hot plate at 100° C. for 1 minute and then at 150° C. for 10 minutes, thereby forming a cured film having a film thickness of 4 μm. Transmittances were measured for each cured film formed on the quartz substrate by changing a wavelength by 2 nm within a range of 400 to 800 nm using a UV-visible spectrophotometer UV-2550 (produced by Shimadzu Corp.). The lowest value of the measured transmittances was determined as the lowest transmittance, which is shown in Table 1. In addition, a surface of each cured film formed on the silicon wafer was observed using an optical microscope at a magnification of 100× to confirm that there were no impurities. Further, the cured films formed on the quartz substrate and the silicon wafer were left in a thermohygrostat at 85° C. and 85% RH for 1,000 hours. Afterward, the lowest transmittance was measured again for each cured film formed on the quartz substrate by changing a wavelength by 2 nm within a range of 400 to 800 nm, and the lowest value of the measured transmittances was determined as the lowest transmittance, which is shown in Table 1. In addition, a surface of each cured film formed on the silicon wafer was observed using an optical microscope at a magnification of 100×. When there was 5% or more decrease in transmittance with respect to the lowest transmittance before leaving for 1,000 hours, heat and moisture resistance were evaluated as "x," when there was less than 5% decrease in transmittance, heat and moisture resistance were evaluated as "○," when impurities were generated on the surface of the cured film after leaving for 1,000 hours, heat and moisture resistance were evaluated as "x," and when no impurities were generated, heat and moisture resistance were evaluated as "○." Evaluation results are shown in Table 1.

TABLE 1

| | | Heat resistance (150° C./1,000 hrs) | | | Heat and moisture resistance (85° C., 85% RH/1,000 hrs) | | |
|---|---|---|---|---|---|---|---|
| | | Lowest transmittance/% (Wavelength 400-800 nm) | | | Lowest transmittance/% (Wavelength 400-800 nm) | | |
| | Chemical resistance | Before heating for 1,000 hrs | After heating for 1,000 hrs | Surface of cured film | Before leaving for 1,000 hrs | After leaving for 1,000 hrs | Surface of cured film |
| Example 1 | ○ | 97 | 95 | ○ | 97 | 97 | ○ |
| Example 2 | ○ | 97 | 95 | ○ | 97 | 97 | ○ |
| Example 3 | ○ | 97 | 94 | ○ | 97 | 97 | ○ |
| Example 4 | ○ | 97 | 94 | ○ | 97 | 97 | ○ |
| Comparative Example 1 | ○ | 97 | 92 | x | 97 | 97 | ○ |
| Comparative Example 2 | ○ | 97 | 96 | ○ | 97 | 97 | x |

From the results shown in Table 1, it is shown that the cured film formed from the resin composition of the present invention exhibited high heat resistance and high heat and moisture resistance, so that the cured film did not color and did not have impurities even after being heated at 150° C. for 1,000 hours and then left at 85° C. and 85% RH for 1,000 hours, as well as high chemical resistance and high transparency. In contrast, the cured film formed from the resin composition prepared in Comparative Example 1 did not exhibit satisfactory heat resistance, and the cured film formed from the resin composition prepared in Comparative Example 2 did not exhibit satisfactory heat and moisture resistance, and therefore it has been identified that these cured films are not suitable for any of a protective film, a planarization film and a microlens.

Figure 1:
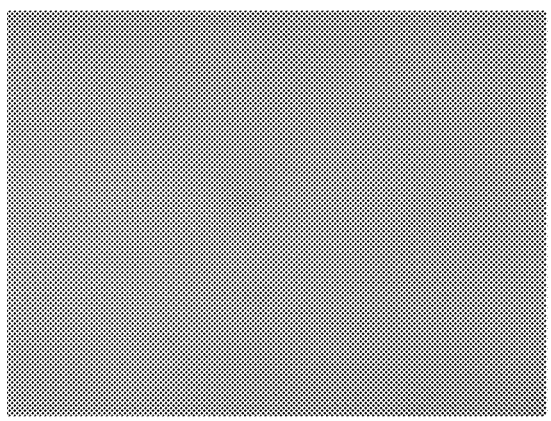
FIG. 1 shows the results of observation of the surface of a cured film using an optical microscope after heating in an oven at 150° C. for 1,000 hours.
Figure 1:
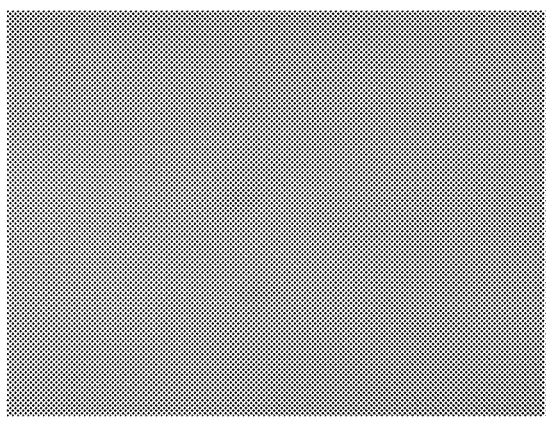
Figure 1:
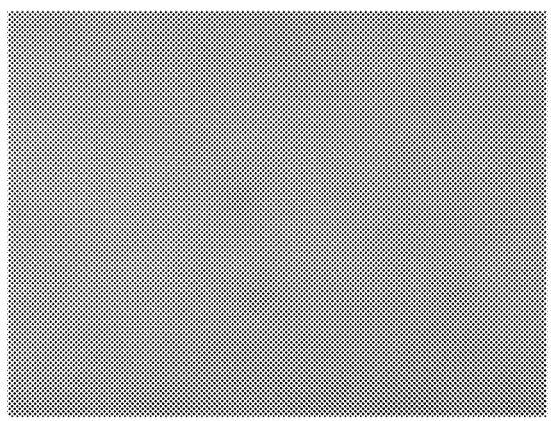
Figure 1:
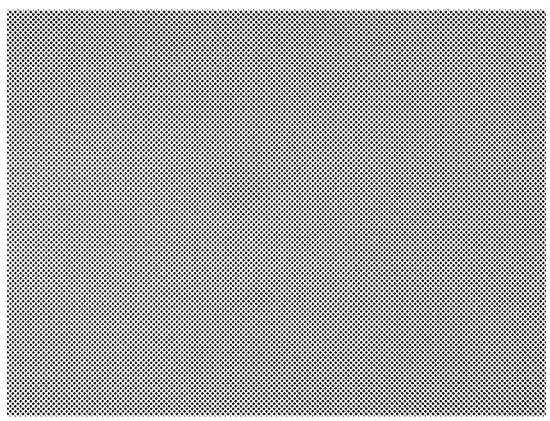
Figure 1:
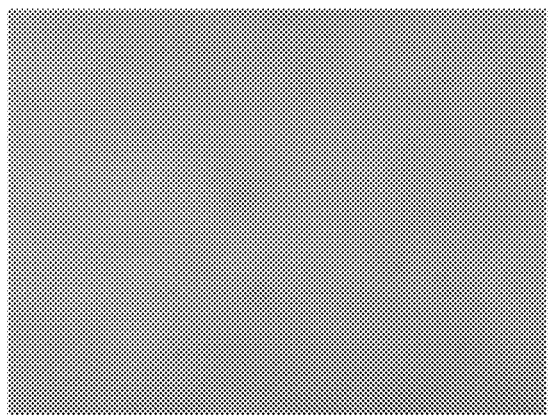
Figure 1:
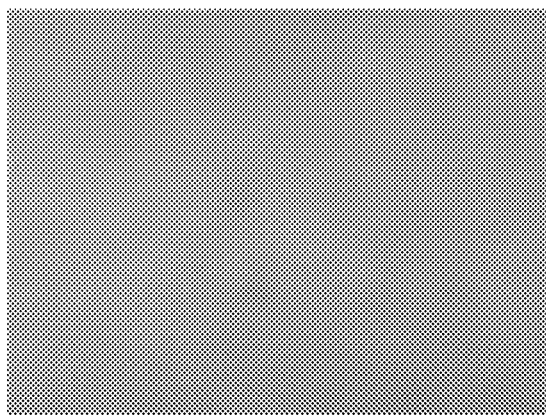
Figure 2:
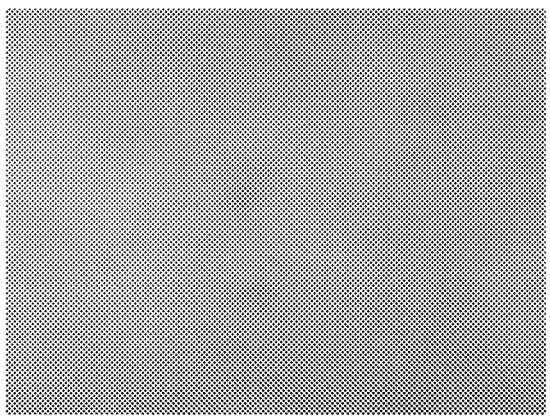
FIG. 2 shows the results of observation of the surface of a cured film using an optical microscope after being left in a thermo-hygrostat at 85° C. and 85% RH for 1,000 hours.
Figure 2:
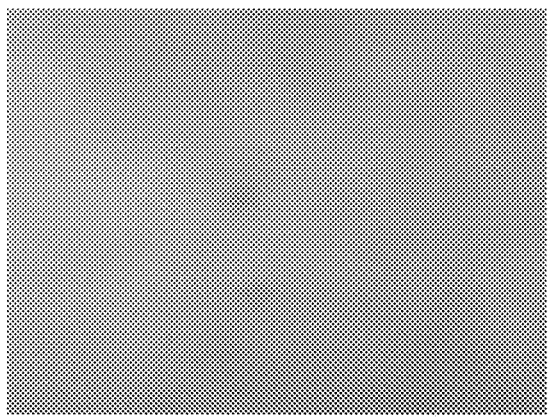
Figure 2:
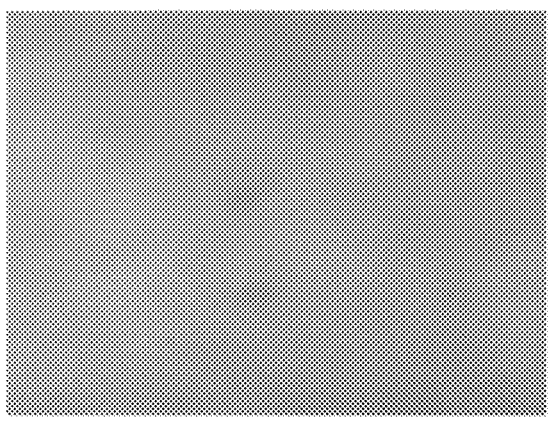
Figure 2:
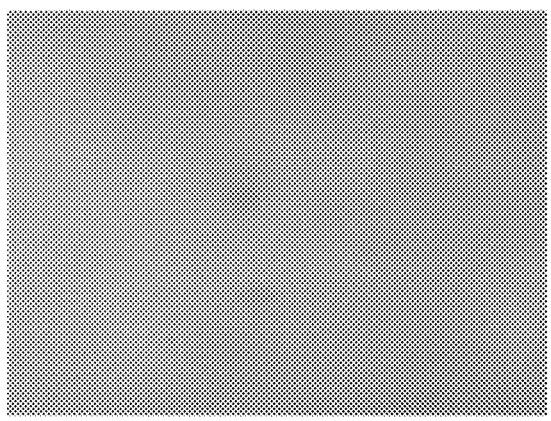
Figure 2:
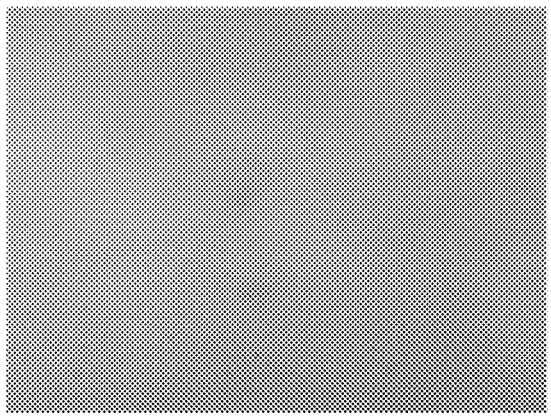
Figure 2:
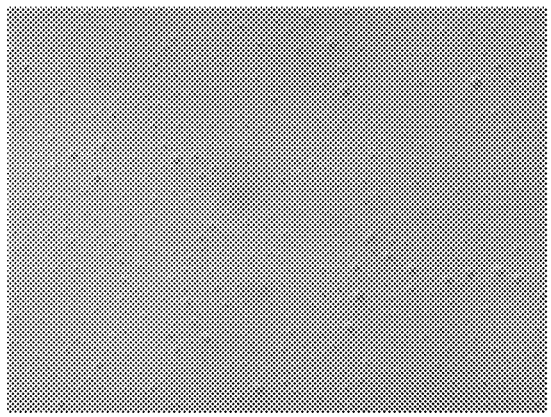

The invention claimed is:

1. A resin composition, consisting of:
(A) component below, (B) component below, a surfactant, and a solvent,
wherein the content of the (B) component is 0.1 to 5.0% by mass with respect to the content of all components of the resin composition, except the solvent:
(A) component: a self-crosslinking copolymer having a structural unit of Formula (1) below and a structural unit of Formula (2) below
(B) component: a compound of Formula (3) below $$\text{(1)}$$

[Structure of Formula (1) with $R^0$, X, $R^1$, $(R^2)_b$, $(OH)_a$, and carbonyl/O groups]

$$\text{(2)}$$

[Structure of Formula (2) with $R^0$, $R^3$, $R^4$]

$$\text{(3)}$$

[Structure of Formula (3): $\left( (OH)_f \text{—ring—}(R^5)_g \text{—} R^6\text{—Y} \right)_h \text{—A}$]

wherein $R^0$ is each independently a hydrogen atom or a methyl group, X is an —O— group or an —NH— group, $R^1$ is a single bond or a linear or branched alkylene group having a carbon atom number of 1 to 6, $R^2$ is a linear or branched alkyl group having a carbon atom number of 1 to 6, a is an integer of 1 to 5, b is an integer of 0 to 4, and a and b satisfy $1 \leq a+b \leq 5$, and $R^2$ are optionally different from each other when b is 2, 3 or 4, $R^3$ is a divalent organic group of Formula (I), (II) or (III) below, the carbonyl group in Formula (I) is bonded to the main chain of the structural unit of Formula (2) when $R^3$ is a divalent organic group of Formula (I) below, $R^4$ is an organic group having an epoxy group, $R^5$ is a linear or branched alkyl group having a carbon atom number of 1 to 6, f is an integer of 1 to 5, g is an integer of 0 to 4, and f and g satisfy $1 \leq f+g \leq 5$, and $R^5$ are optionally different from each other when g is 2, 3 or 4, $R^6$ is a single bond or a linear or branched alkylene group having a carbon atom number of 1 to 6, Y is a single bond or an ester bond, A is a monovalent, divalent, trivalent or tetravalent organic group which optionally contain at least one hetero atom, or a hetero atom, and h is an integer of 1 to 4

$$\text{(I)}$$

[Structure of Formula (I): carbonyl —O—$(\text{—})_e$—$]_c$ O—]

$$\text{(II)}$$

[Structure of Formula (II): —O—$(\text{—})_e$—$]_d$ O—]

-continued

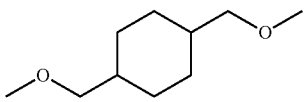
(III)

wherein c is an integer of 0 to 3, d is an integer of 1 to 3, and e in each formula is independently an integer of 2 to 6, wherein the self-crosslinking copolymer of the (A) component optionally further comprises a structural unit of Formula 4 below:

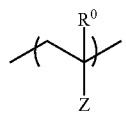
(4)

wherein Z is a phenyl group, a biphenylyl group or a naphthyl group, some or all of hydrogen atoms of the phenyl group, the biphenylyl group and the naphthyl group is optionally substituted with an alkyl group having a carbon atom number of 1 to 10, an alkoxy group having a carbon atom number of 1 to 10, a cyano group or a halogeno group.

2. The resin composition according to claim 1, wherein the structural unit of Formula 2 is a structural unit of Formula (2-1) or (2-2) below:

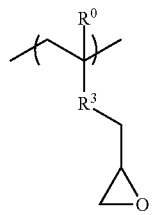
(2-1)

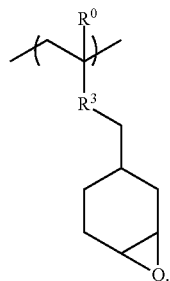
(2-2)

3. The resin composition according to claim 1, wherein the self-crosslinking copolymer of the (A) component further comprises the structural unit of Formula 4

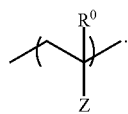
(4)

4. The resin composition according to claim 1, wherein the self-crosslinking copolymer has a weight average molecular weight of the 1,000 to 100,000.

5. The resin composition according to claim 1, wherein the hetero atom is a nitrogen atom, an oxygen atom or a sulfur atom.

6. The resin composition according to claim 1, which is used as a protective film.

7. The resin composition according to claim 1, which is used as a planarization film.

8. The resin composition according to claim 1, which is used as a microlens.

9. A method for manufacturing a cured film, comprising:
applying the resin composition according to claim 1 onto a base and baking the resulting resin composition at 80 to 300° C. for 0.3 to 60 minutes.

10. A method for manufacturing a microlens, comprising:
applying the resin composition according to claim 1 onto a base and baking the resulting resin composition at a temperature in a range of from 80 to 300° C. for 0.3 to 60 minutes to manufacture a cured film;

forming a resist pattern on the cured film reflowing the resist pattern by heat treatment to form a lens pattern; and performing etch-back of the cured film by using the lens pattern as a mask to transfer the shape of the lens pattern to the cured film.

11. The method for manufacturing a microlens according to claim 10, wherein the base is a substrate having a color filter formed thereon.

* * * * *